(12) United States Patent
Rault et al.

(10) Patent No.: US 8,433,970 B2
(45) Date of Patent: Apr. 30, 2013

(54) TECHNIQUES TO CONTROL POWER CONSUMPTION IN AN ITERATIVE DECODER BY CONTROL OF NODE CONFIGURATIONS

(75) Inventors: David Rault, Hede-Bazouges (FR); Olivier Souloumiac, St. Sulpice la Foret (FR)

(73) Assignee: Silicon Laboratories Inc., Austin, TX (US)

( * ) Notice: Subject to any disclaimer, the term of this patent is extended or adjusted under 35 U.S.C. 154(b) by 443 days.

(21) Appl. No.: 12/751,076

(22) Filed: Mar. 31, 2010

(65) Prior Publication Data

US 2011/0246850 A1   Oct. 6, 2011

(51) Int. Cl.
*G06F 11/00* (2006.01)

(52) U.S. Cl.
USPC .......................................... 714/752; 713/324

(58) Field of Classification Search .................. 714/752; 713/100, 324
See application file for complete search history.

(56) References Cited

U.S. PATENT DOCUMENTS

| | | | |
|---|---|---|---|
| 5,535,220 A | 7/1996 | Kanno et al. | |
| 5,754,252 A | 5/1998 | Kuhn et al. | |
| 6,128,043 A | 10/2000 | Tulder | |
| 6,542,203 B1 | 4/2003 | Shadwell et al. | |
| 6,625,234 B1 | 9/2003 | Cui et al. | |
| 6,630,964 B2 | 10/2003 | Burns et al. | |
| 6,721,908 B1 | 4/2004 | Kim et al. | |
| 6,862,325 B2 | 3/2005 | Gay-Bellile et al. | |
| 7,106,388 B2 | 9/2006 | Vorenkamp et al. | |
| 7,170,849 B1 | 1/2007 | Arivoli et al. | |
| 7,265,792 B2 | 9/2007 | Favrat et al. | |
| 7,369,835 B2 | 5/2008 | Margairas et al. | |
| 7,426,240 B2 | 9/2008 | Peron | |
| 7,440,392 B2 | 10/2008 | Hwang | |
| 7,774,674 B2 * | 8/2010 | Wehn et al. | 714/752 |
| 7,783,958 B1 * | 8/2010 | Eidson et al. | 714/780 |
| 2002/0085648 A1 | 7/2002 | Burns et al. | |
| 2004/0123226 A1 | 6/2004 | Lee et al. | |
| 2005/0265486 A1 | 12/2005 | Crawley | |
| 2005/0280742 A1 | 12/2005 | Jaffe | |
| 2006/0158568 A1 | 7/2006 | Kaylani et al. | |
| 2006/0206778 A1 | 9/2006 | Wehn et al. | |
| 2006/0222115 A1 | 10/2006 | Dornbusch et al. | |
| 2008/0086671 A1 | 4/2008 | Garg et al. | |
| 2008/0148133 A1 * | 6/2008 | Duggan | 714/796 |

(Continued)

FOREIGN PATENT DOCUMENTS

| | | |
|---|---|---|
| WO | WO 03067877 | 8/2003 |
| WO | WO 2007001305 A1 | 1/2007 |

OTHER PUBLICATIONS

U.S. Patent and Trademark Office, Office Action mailed Sep. 23, 2010 and Reply filed Dec. 20, 2010 in U.S. Appl. No. 11/903,910.

(Continued)

*Primary Examiner* — Marc Duncan
(74) *Attorney, Agent, or Firm* — Trop, Pruner & Hu, P.C.

(57) ABSTRACT

A method for controlling power consumption of an iterative decoder based on one or more criteria is described. The method may include performing iterative decoding on a demodulated signal to provide a decoded signal, receiving information regarding the iterative decoding, and based on the information controlling a number of nodes of the iterative decoder to enable during a next iteration of the iterative decoding.

19 Claims, 8 Drawing Sheets

U.S. PATENT DOCUMENTS

| | | | |
|---|---|---|---|
| 2009/0094470 | A1 | 4/2009 | Gao et al. |
| 2009/0172493 | A1* | 7/2009 | Park et al. ............ 714/752 |
| 2009/0213275 | A1 | 8/2009 | Trager |
| 2009/0249160 | A1* | 10/2009 | Gao et al. ............ 714/752 |
| 2010/0031115 | A1* | 2/2010 | Patapoutian et al. ...... 714/752 |
| 2010/0070818 | A1* | 3/2010 | Ulriksson ............ 714/752 |
| 2010/0110305 | A1 | 5/2010 | Chou et al. |
| 2010/0272011 | A1* | 10/2010 | Palanki et al. ............ 370/328 |
| 2010/0306616 | A1 | 12/2010 | Kishimoto et al. |
| 2011/0246849 | A1 | 10/2011 | Rault et al. |
| 2011/0246850 | A1 | 10/2011 | Rault et al. |

OTHER PUBLICATIONS

U.S. Appl. No. 12/751,052, entitled "Reducing Power Consumption in an Iterative Decoder," filed Mar. 31, 2010 by David Rault, et al.

U.S. Appl. No. 12/751,022, entitled "Multi-Standard Digital Demodulator for TV Signals Broadcast Over Cable, Satellite and Terrestrial Networks," filed Mar. 31, 2010 by Pascal Blouin, et al.

U.S. Appl. No. 12/493,955, filed Jun. 29, 2009, entitled, "Digital Signal Processor (DSP) Architecture for a Hybrid Television Tuner," by Alan Hendrickson, et al.

U.S. Appl. No. 12/603,877, filed Oct. 22, 2009, entitled, "Digital Signal Processor (DSP) Architecture for a Hybrid Television Tuner," by Alan Hendrickson, et al.

U.S. Appl. No. 12/551,146, filed Aug. 31, 2009, entitled, "Digital Phase Lock Loop Configurable as a Frequency Estimator," by Li Gao.

Ahmad Darabiha, "Power Reduction Techniques for LDPC Decoders," pp. 1-10.

ETSI, Draft ETSI EN 302 307, "Digital Video Broadcasting (DVB); Second generation framing structure, channel coding and modulation systems for Broadcasting, Interactive Services, News Gathering and other broadband satellite applications," V1.1.1, 2004-2006, pp. 1-74.

MICRONAS, "DRX 3960A Digital Receiver Front-End," Feb. 8, 2001, pp. 1-30.

NXP, "TDA 8295 Digital Global Standard Low IF Demodulator for Analog TV and FM Radio," Feb. 4, 2008, pp. 1-77.

XCEIVE, "Welcome to Xceive at CES 2007, Upgrade Your Tuner! Get XC5000," 2007, pp. 1-28.

XCEIVE, "XC5000 Product Brief," Dec. 2006, pp. 1-2.

U.S. Appl. No. 12/323,040, filed Nov. 25, 2008, entitled "Low-Cost Receiver Using Automatic Gain Control," by Ramin K. Poorfard, et al.

U.S. Patent and Trademark Office, Office Action mailed Apr. 26, 2012 with Reply filed Jul. 23, 2012 in U.S. Appl. No. 12/751,052.

U.S. Patent and Trademark Office, Notice of Allowance and Issue Fee Due mailed Mar. 29, 2012 in U.S. Appl. No. 12/751,022.

* cited by examiner

TECHNIQUES TO CONTROL POWER CONSUMPTION IN AN ITERATIVE DECODER BY CONTROL OF NODE CONFIGURATIONS

BACKGROUND

Iterative decoding is a very powerful decoding technique used in many forward error correction (FEC) circuits for digital demodulation (and also for storage). Several standards implement decoding techniques such as Turbo codes and low density parity check (LDPC) decoding. For example, Turbo code is used in 3GPP and IEEE 802.16 standards, and LDPC is used in various recent digital video broadcast (DVB) standards including DVB-S2, DVB-T2 and DVB-C2. Iterative decoding outperforms error correcting capabilities in comparison with classical decoding. However iterative decoding implies a higher decoding frequency in order to perform many iterations and also increases complexity of a demodulator.

To realize high performance and high bit decoding throughput, the drawback is an increase in power consumption and thus power dissipation for a package that includes such a decoder. The typical power consumption for iterative decoding can be 50% or more of an entire chip's power consumption. Existing techniques for power reduction in LDPC decoding are based on reducing the iteration number or the activities of check node processors of the decoder when the iterative decoder is correcting errors successfully.

SUMMARY OF THE INVENTION

According to one aspect, the present invention includes an iterative decoder that can be configured to enable reduced power consumption. For purposes of illustration, a LDPC decoder is described, however embodiments are not limited to any particular type of iterative decoder.

A representative decoder may include a set of nodes, each generally including a variable node processor to receive a channel input and at least one check node value to enable calculation of a variable node value, and a check node processor to receive at least one variable node value and to calculate a check node value including a parity value and a magnitude value and provide a first output having a first value if the parity value is of a false parity, and corresponding variable node and check node memories. The variable node and check node processors may be coupled via a shuffle unit. In turn, an adder may be coupled to the check node processors to receive the first outputs and to generate a false parity sum. In addition, a controller may be coupled to the adder to receive the false parity sum and to control iterative decoding on a current block of the channel input based at least in part on the false parity sum.

Such control may be realized using different criteria, depending on a desired implementation. Example criteria include controlling a number of nodes to be enabled, based at least in part on the false parity sum, such as based on comparison of the sum to a first threshold. Another example may be to control the number of nodes based on comparison a false parity sum of a current iteration to a false parity sum of a previous iteration. In yet other implementations control of the number of nodes may be based on an estimate of a noise level of a signal from which the channel input is obtained.

Another aspect of the present invention is directed to a method for controlling power consumption of an iterative decoder based on one or more criteria. To this end, the method may include performing iterative decoding on a demodulated signal to provide a decoded signal, determining a number of nodes to enable for a next iteration of the iterative decoding based on information regarding the iterative decoding, and controlling the iterative decoding accordingly.

Embodiments may be incorporated into a system such as a receiver to receive radio frequency (RF) signals of any of multiple digital video broadcasting (DVB) standards and to downconvert the received RF signal to a baseband signal and demodulate the baseband signal into a demodulated signal. This receiver may include a forward error correction (FEC) circuit including an iterative decoder such as described above. In turn, the iterative decoder can be controlled to reduce power consumption using a controller that control a number of nodes enabled for the iterative decoding based at least in part on information regarding a number of iterations performed on a current block of the demodulated signal.

DETAILED DESCRIPTION

Figure 1:
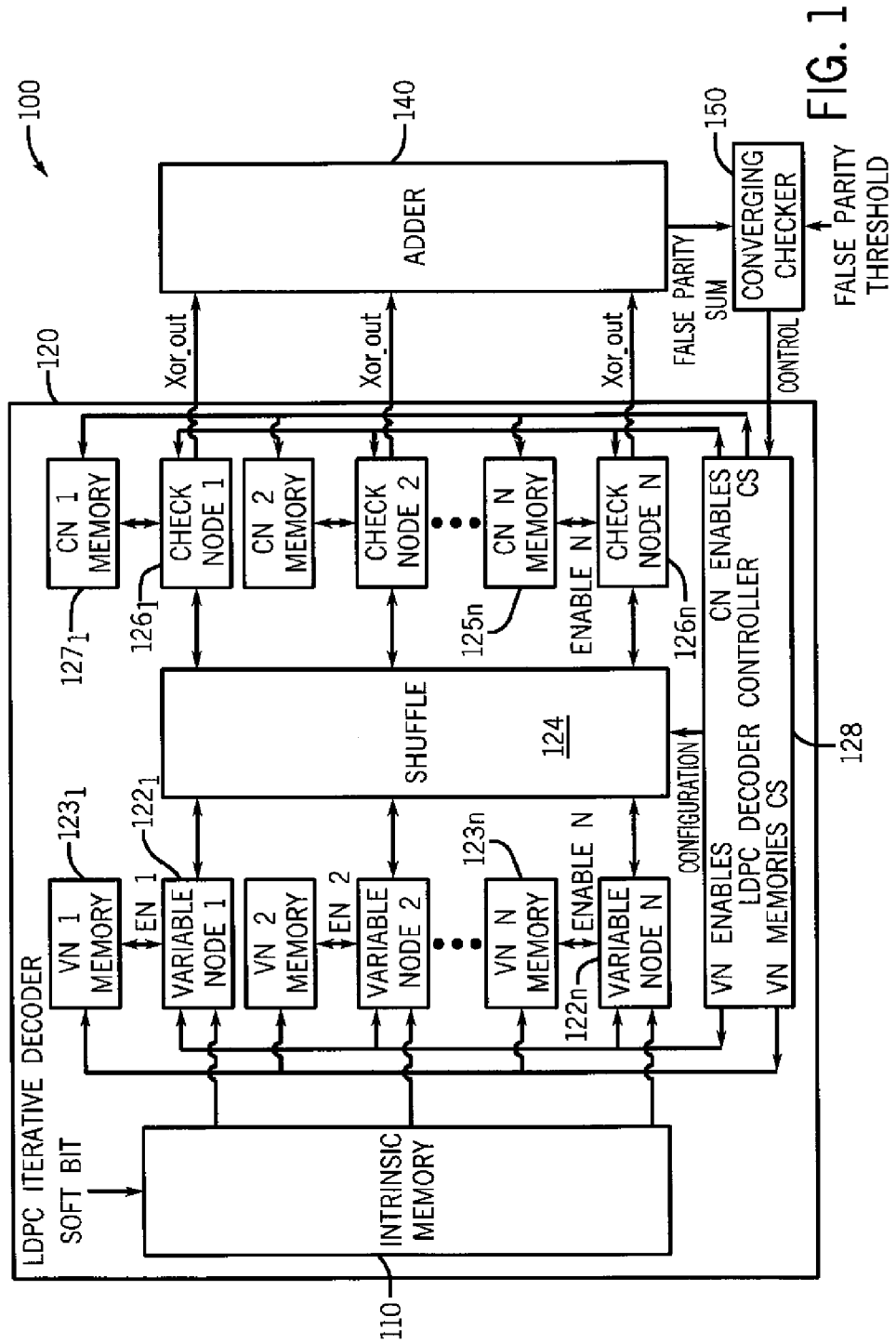
FIG. 1 is a block diagram of an iterative decoder in accordance with one embodiment of the present invention.

In various embodiments, an iterative decoding architecture may allow a tradeoff between power consumption and decoding performance. To this end, embodiments may control the availability of individual units of a decoder for performing decoding. In an LDPC implementation, control of the number of available variable node processors and check node processors may be made according to one or more criteria. In addition, embodiments may reduce peak power consumption and allow adaptation of a decoder to a particular power supply.

More specifically, embodiments may perform control techniques by enabling only a sub-set of available variable node processors/check node processors to realize flexibility in power reduction, e.g., on a frame-by-frame basis and/or between decoding iterations. Without limiting the number of iterations performed, embodiments thus allow maintaining the same performance. Although using a sub-set of variable node processors/check node processors could reduce the maximum number of iterations, it is possible to get a balancing effect due better iterative decoding convergence. According to various criteria, embodiments thus may provide a tradeoff between power consumption and performance.

As will be described further below, the number of variable node processors/check node processors of an iterative decoder used can be modified according to various criteria, with possible modifications of the number of enabled nodes at each iteration. In addition, the decoder architecture can be optimized to reduce power according to the used number of variable node processors/check node processors. As such, memories for variable node processors and check node processors can be gathered in sub-sets in order to use a single memory chip select for each sub-set (or individually). A controller in accordance with an embodiment of the present invention may thus control memory chip select signals and variable node processor/check node processor enable signals for each sub-set, so that unused memories are not selected and unused variable node processors/check node processors are switched off.

Sub-set activation in accordance with an embodiment of the present invention may be used according to different criteria in order to not penalize performance, and can be adapted according to a previous iteration result. Moreover, some LDPC code gets better iterative decoding convergence and can benefit from using a lower sub-set of variable node processors/check node processors even if there is a reduction in the maximum number of iterations. For example when using half of the variable node/check node processors (VN/CN), the maximum iterations are reduced by 2. If 50 iterations are used in place of 100 the performance should be the same, but if 25 iterations are performed in place of 50 then performance could be reduced due to the missing iterations. But for some LDPC code, using less processors allows better iterative decoding converging and thus less iterations are needed. The iterative convergence improvement is due to allowing VN/CN processors to use previous VN/CN computations from other parity check equations. So using the previous example, 25 iterations could be an interesting trade off when checking the iterative decoding converging. Moreover a reduced sub-set of VN/CN processors could be used during 10 iterations and if the convergence is not good, all VN/CNs may be enabled to reach 40 iterations in place 25.

Several criteria can be used in order to select the number of variable node processors/check node processors to be enabled in the LDPC decoder. In some implementations, the non-enabled processing units can be placed in a standby mode with no activity. One criterion may be to use a signal-to-noise (SNR) estimator and adapt variable node processors/check node processors sub-sets accordingly. As will be described below, a SNR can be compared to a threshold, and when it is higher than this threshold, a sub-set of nodes (generally including a variable node processor, check node processor, and corresponding memory) can be enabled instead of all nodes to reduce power consumption. For example, when the SNR is 1 dB higher than a level needed for good iterative decoding (e.g., a threshold level) then the number of iterations needed can be low (e.g., below half of the maximum number of iterations). Instead of running fewer iterations using all variable node processors/check node processors, embodiments may use only a sub-set of them.

Yet another criterion is to determine whether the iterative decoding is converging. Iterative decoding convergence can be evaluated by counting for each iteration the number of updated intrinsic values below a threshold (if an updated intrinsic value is below the threshold, then it implies that it is not a safe/stabilized value; in this case, the soft bit confidence is low). For LDPC decoding, it is possible to compute at each iteration a parity check result for all equations and then to obtain the sum of false parity check equations per iteration. By computing the number of false parity equations, an accurate measure of the correcting effect can be obtained. This false parity number should decrease for each iteration when the decoder succeeds to correct errors. This information may allow a more precise determination of when it will be interesting to use or modify the variable node processor/check node processor sub-sets for the best trade-off between power consumption and performance. The advantage of this criteria is that a continuous check on the processing performed by the iterative decoder on a frame-by-frame basis for each iteration can occur (not globally like for the previous criteria). Thus the system can continuously control the iterative decoding success and adapt efforts to get the best trade-off between performance and power consumption.

Yet a further criterion may be to use a continuous checking on a statistic on the number of iterations used to decode the bits. This criteria may be based on implementation of the iterative decoding converging checking described above to stop the iterative decoder when all errors appear to be corrected. Then with few error bits, only some iterations are necessary. However, the LDPC decoder uses a high number of iterations when there are more bit errors to correct. According to this criterion, a value (e.g. a mean value) based on the number of iterations used to decode can be determined and compared to a threshold. Another way may be to count the number of iterations higher than a threshold on a time sliding window or on some frames. If the mean (or previous counter) result is higher than a threshold, it can be assumed that the decoder needs a higher variable node processor/check node processor sub-set or all available variable node processors/check node processors.

Note that a system can use several of the previous criteria together. In different implementations, the controls and thresholds can be performed via a processor and/or under firmware control. In yet other embodiments, an iteration index threshold may be used to switch between different variable node processor/check node processor activation, as will be described below.

While an iterative decoder may take many forms in various embodiments, referring now to FIG. 1 shown is a block diagram of an iterative decoder in accordance with one embodiment of the present invention. As shown in FIG. 1, decoder 120 may be part of a receiver 100 such as a digital receiver to receive and demodulate incoming IF signals such as TV signals of a given DVB standard. As seen in FIG. 1, decoder 120 may be an LDPC decoder. However according to various embodiments any type of iterative decoder may be possible. The LDPC decoder could be full parallel or semi-parallel. In a semi-parallel mode for example ½ VN/CN parity equations are processed and when completed, the remaining ½ VN/CN may be used to process parity equations. Here the clock cycles can be doubled and the maximum iterations reduced by two.

Incoming bits which may be soft bits of a channel input, e.g., as determined via an equalizer and demapper may be provided and stored in an intrinsic memory 110. As one example, intrinsic memory 110 may be an internal store such as a random access memory (RAM). The soft bits may be provided from intrinsic memory 110 to iterative decoder 120, and more specifically each bit of the channel input from the intrinsic memory may be provided to a corresponding one of a plurality of variable node processors $122_1$-$122_N$.

As seen in the configuration of FIG. 1, each variable node processor 122 may be coupled to a corresponding variable node memory $123_1$-$123_N$. In addition, each of the variable node processors 122 is further coupled to a shuffle unit 124, which may provide interconnections between the variable nodes and one or more of a plurality of check node processors $126_1$-$126_N$. In turn, check node processors 126 each may be coupled to a corresponding check node memory $127_1$-$127_N$.

In one embodiment, decoder 120 may be configured as a min-sum decoder. Each decoding iteration includes updating and transferring a message in the form of a log-likelihood ratio (LLR). At the beginning of min-sum decoding, the variable node processors pass a LLR value of the incoming soft bits to a neighboring check node processor via the shuffle unit. In each iteration, a check update occurs followed by a variable update. During the check update, the check node processors determine and output as a magnitude a minimum of the input magnitudes, and a sign as a parity of the signs of the inputs. During the variable update phase, the variable node processors calculate a sum of the inputs from the check node processors plus the channel input. Further details regarding operation of an iterative decoder can be found in Annex G.2 of ETSI EN 302 307 V.I.I.I. (2004-06).

Thus, a min-sum operation occurs. The check node processors perform a computation (e.g., MIN operation in min-sum decoding), the outputs of which are provided back to the variable node processors through shuffle unit 124. In turn, the inputs to the variable node processors arrive from the intrinsic memory and one or more check node processors. The shuffle unit thus may be used in the two directions. After performing the message update (e.g., SUM operation in min-sum decoding), the variable node processor outputs are sent back to the check node processors for the next decoding iteration. Decoding proceeds with all check node processors and variable node processors alternately performing their computations for a predetermined number of iterations, after which the decoded bits are obtained from one final computation performed by the variable node processors and provided to, e.g., a hard decoder 130.

As seen, each of the variable node processors, check node processors and the shuffle unit may be under control of a decoder controller 128. More specifically, as shown in FIG. 1, controller 128 may provide an individual variable node enable signal to each of the variable node processors 122. Similarly, individual check node enable signals may be provided to each of check node processors 126. Still further, individual node memory chip select signals may be provided to each of variable node memories 123 and check node memories 127. Controller 128 may further provide configuration information to shuffle unit 124 to enable the shuffle unit to communicate information between the check nodes and variable nodes that are enabled for a given iteration. In this way, controller 128 can individually enable each of the variable node processors, check node processors and corresponding node memories. While these enable signals may be individually provided and controlled, in many implementations such control may be on a subset basis such that certain numbers of the variable nodes, check nodes and corresponding memories can be commonly enabled/disabled. Decoder controller 128 may thus operate to control the iterative decoding process by individually controlling which variable node processors, check node processors and corresponding node memories are to be enabled for a given iteration of the iterative decoding using one or more criteria, as discussed above and will be described further below As further seen in FIG. 1, check node processors 126 each also may output an exclusive-OR (XOR) value to an adder 140, which corresponds to the parity output of the check node processors. Adder 140 then sums these XOR values to determine a false parity sum. That is, each check node processor 126 may output an XOR value of a first logic value (e.g., a logic one value) when a false parity is detected for the corresponding check node. As result, adder 140 may thus generate a false parity sum which it provides to a convergence checker 150. Based on the false parity sum, in addition to other information (e.g., a false parity threshold, constellation and code rate, which it may receive from a processor or other controller such as a microcontroller), convergence checker 150 may generate a control signal which may be sent to controller 128 to thus control the number of nodes enabled to perform the iterative decoding in decoder 120. While shown with this particular implementation in the embodiment of FIG. 1, understand the scope of the present invention is not limited in this regard.

Figure 2:
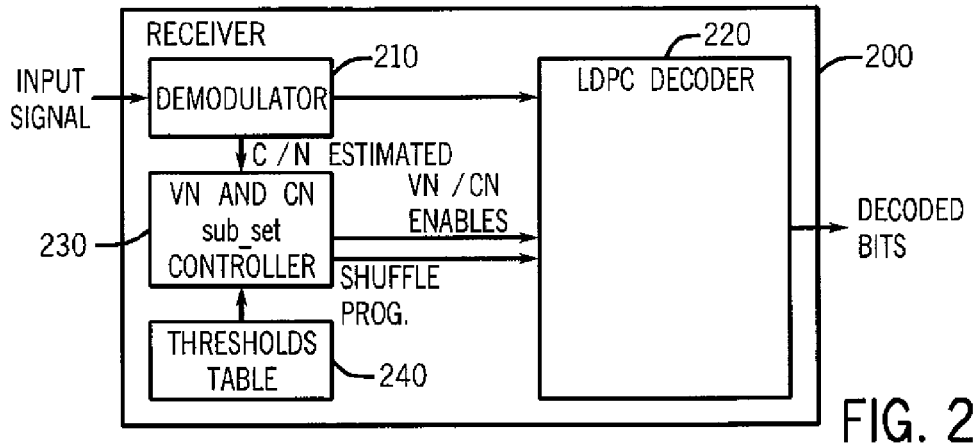
FIG. 2 is a high-level block diagram of a receiver in accordance with one embodiment of the present invention.

Note that an iterative decoder in accordance with an embodiment of present invention can be implemented in many different types of systems. Referring now to FIG. 2, shown is a high-level block diagram of a receiver in accordance with one embodiment of the present invention. As shown in FIG. 2, receiver 200 may receive an input signal. While the receiver may include various front-end circuitry, for ease of discussion the input signal is shown being provided directly to a demodulator 210. In various embodiments, demodulator 210 may be a digital demodulator that operates in accordance with any given DTV standard to receive incoming signals, e.g., at a digital IF frequency, and to demodulate the signal down to baseband. As seen in the embodiment FIG. 2, demodulated signals output from demodulator 210 may be provided to iterative decoder 220. While shown as being directly coupled in the embodiment of FIG. 2, understand that the scope of the present invention is not limited in this aspect. That is, in many implementations additional signal processing circuitry such as an equalizer or other signal processing circuitry may be present in the signal processing path between demodulator 210 and iterative decoder 220.

To control power consumption in iterative decoder 220, various information may be provided to a power controller 230. As seen, power controller 230 may generate various signals to be provided to iterative decoder 220. Specifically in the embodiment of FIG. 2, such signals may include variable node processor/check node processor enable signals to indicate to decoder 220 which one or more variable node processors and check node processors are to be enabled for a given iteration. Still further, shuffle program signals may be sent to decoder 220 to configure its shuffle unit to provide appropriate connection paths between the selected enabled variable node processors and check node processors. In addition, based on these various enable signals, decoder 220 (and more specifically a controller within decoder 220) may generate appropriate chip select signals for the node memories associated with the selected check and variable node processors. Note that in some embodiments, an additional signal may be sent to limit decoder 220 to perform no more than a maximum number of iterations.

As seen, power controller 230 is coupled to receive a SNR estimate signal from demodulator 210 and threshold information from a threshold table 240. In general, the SNR estimate signal may be determined using a SNR estimator, which may be located within the demodulator 210 or another portion of receiver 200. Threshold table 240 may store various threshold information associated with the different types of processing that can be performed in the decoder. For example, the threshold table may store a table of threshold SNRs (e.g., expressed in dB) for each constellation and code rate used (in addition to other parameters affecting the signal-to-noise ratio). Based on a given SNR estimate and the corresponding threshold, power controller 230 may generate the appropriate enable and shuffle program signals. While shown with this particular implementation in the embodiment of FIG. 2, understand scope of the present invention is not limited in this regard.

Figure 3:
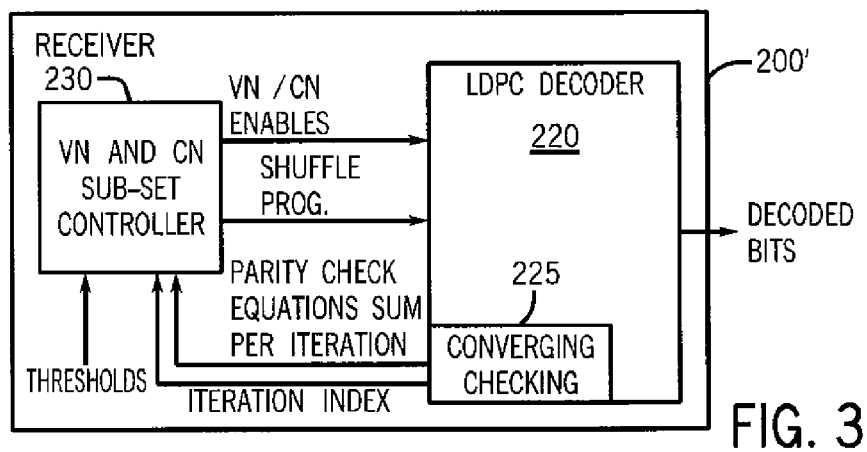
FIG. 3 is a block diagram of a receiver to perform power control based on convergence checking in accordance with one embodiment of the present invention.

In addition to controlling power consumption of iterative decoding based on signal-to-noise ratio, instead (or in addition) power control may occur when decoding is not proceeding favorably. Referring now to FIG. 3, shown is a block diagram of a receiver to accommodate power control based on convergence checking. In general, receiver 200' may be similarly configured to that of receiver 200 of FIG. 2. Note that the demodulator and threshold table however are not shown in FIG. 3 for ease of illustration. Instead a convergence checker 225, which is shown in FIG. 3 as being internal to the iterative decoder 220, may be present. This convergence checker may receive a confidence threshold and based on information from the decoding process generate a sum value which is indicative of a no confidence decision for the soft bits generated in iterative decoder 220. More specifically, the sum value may be a sum of false parity check operations performed by the check node processors. In one embodiment, the confidence threshold may be received from a controller of the system, e.g., a digital signal processor of a receiver. However, the threshold may be received from other locations such as an embedded hardware controller with look-up table according to constellation, code rate and other parameters.

In operation of the iterative decoder of FIG. 3, one or more thresholds may be provided to power controller 230. These thresholds may correspond to one or more confidence thresholds or false parity sum thresholds for the LDPC decoder. Based on such thresholds and the sum value provided by convergence checker 225, power controller 230 may generate the appropriate enable and shuffle program signals to be sent to iterative decoder 220, which may in turn enable/disable selected subsets of the node processors/memories, as discussed above regarding FIG. 2. While shown as a separate control criteria in the embodiment of FIG. 3, understand that this convergence information may be combined with the SNR information discussed above in the FIG. 2 implementation.

In another implementation, a power control decision can be made based on a statistic regarding the number of iterations used to decode a data block, for example, an analysis of how many data blocks (e.g., of a frame size or based on a sliding window) for which a maximum number of iterations are performed (or how many times the iteration index is higher a threshold). When a maximum number of iterations are performed for a given frame (or the iteration index exceeds the threshold), this is an indication that there are difficulties in the decoding and the controller should increase the number of VN/CN processors in order to get more iterations. Said differently, when the receiving conditions are good, there are less nodes in use, which can help find a power/performance trade-off.

Figure 4:
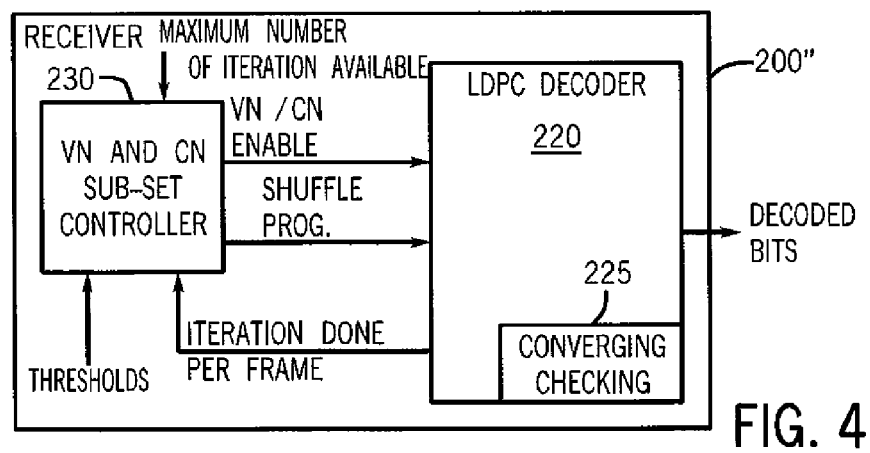
FIG. 4 is a block diagram of a decoder in accordance with another embodiment of the present invention.

Referring now to FIG. 4, shown is a block diagram of a decoder to control power consumption based on an iteration index analysis. As seen in FIG. 4 receiver 200" includes an iterative decoder 220 that is coupled to receive node enable signals and shuffle program signals provided by power controller 230. In the embodiment of FIG. 4, power controller 230 may receive an indication of a number of iterations of the iterative decoder 220 that was performed for each data block (e.g., frame), e.g., from convergence checker 225. Based on this information as well as certain threshold information and the maximum number of iterations allowed, the control signals may be provided to iterative decoder 220 to thus increase power consumption by controlling the number of nodes enabled for operation, e.g., when the decoder may be having difficulties. Note that while the above discussion of FIGS. 2-4 is described independently, in different implementations one or more of these different criteria can be combined to control power consumption in an iterative decoder. Thus if the iteration index is often higher than the threshold or at the maximum, then iterations are needed so more VN/CN can be enabled in order to get more iterations. On the contrary, when successful decoding occurs with few iterations a fewer number of VN/CN may be enabled.

A power controller in accordance with an embodiment of the present invention may perform various operations to control power consumption of an iterative decoder based on analysis of one or more different types of criteria such as discussed above. Further, understand that while shown in the implementations of FIGS. 2-4 as a separate power controller of a receiver, embodiments may be implemented in various circuitry of a receiver, including within a decoder itself, a DSP or other microcontroller unit of a receiver.

Figure 5:
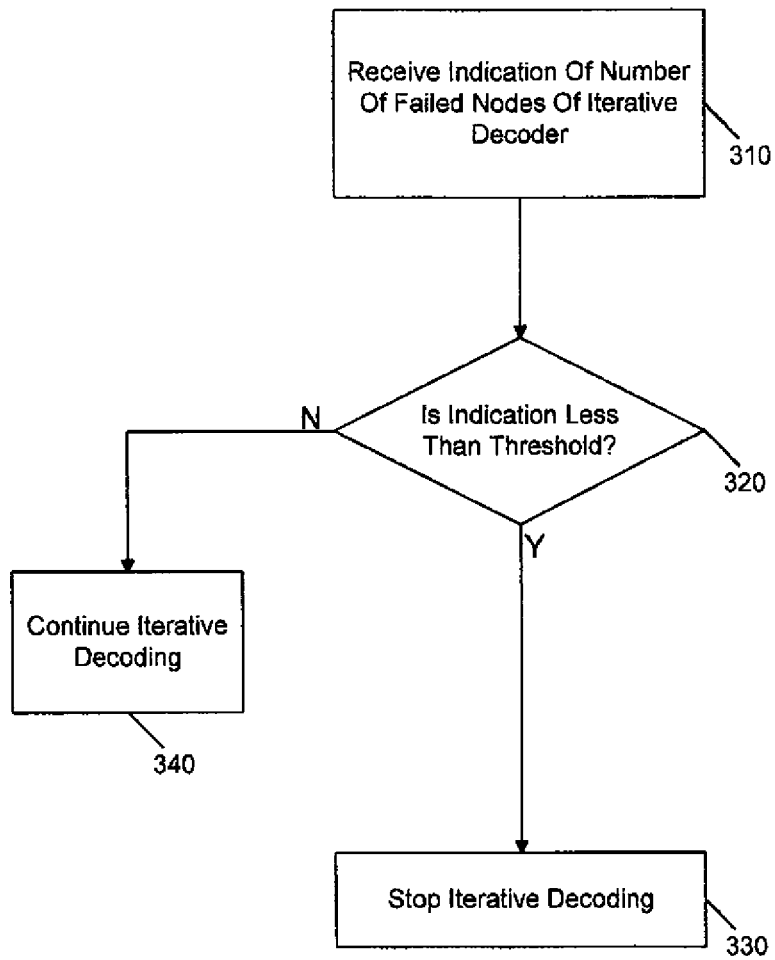
FIG. 5 is a flow diagram of a method for controlling power consumption of an iterative decoder in accordance with an embodiment of the present invention.

Referring now to FIG. 5, shown is a flow diagram of a method for controlling power consumption of an iterative decoder in accordance with an embodiment of the present invention. As shown in FIG. 5, method 300 may be used to perform power reduction based on successful error correction in an iterative decoder.

As seen, method 300 may begin by receiving an indication of a number of failed nodes of an iterative decoder for each iteration (block 310). This indication may be provided in various manners. For example, in an embodiment of an LDPC decoder, this indication may be by way of a false parity check equations sum. However, more generally for an iterative decoder, the indication may be a bit sum of a low confidence or no confidence decision for a soft bit. As seen, this received indication may be compared to a threshold to determine whether the indication is less than the threshold (diamond 320). While the scope of the present invention is not limited in this regard, this threshold may be at a given level, e.g., one if no outer code and else ten. If the number of the indication is below this threshold, meaning that the number of errors is lower than the threshold, the controller may control the iterative decoder to stop iterative decoding (block 330). That is, as the decoding is successfully realized, further iterations may only act to consume power needlessly. Note that while a given threshold may be present, in an implementation where additional error correction coding such as an outer code is present, this threshold may be greater in the presence of the possibility of additional error correction performed elsewhere in a receiver.

Still referring to FIG. 5, if instead at diamond 320 it is determined that the indication is greater than the threshold, control passes to block 340 where iterative decoding may be continued. While shown with this particular implementation in the embodiment of FIG. 5, understand the scope of the present invention is not limited in this regard.

Figure 6:
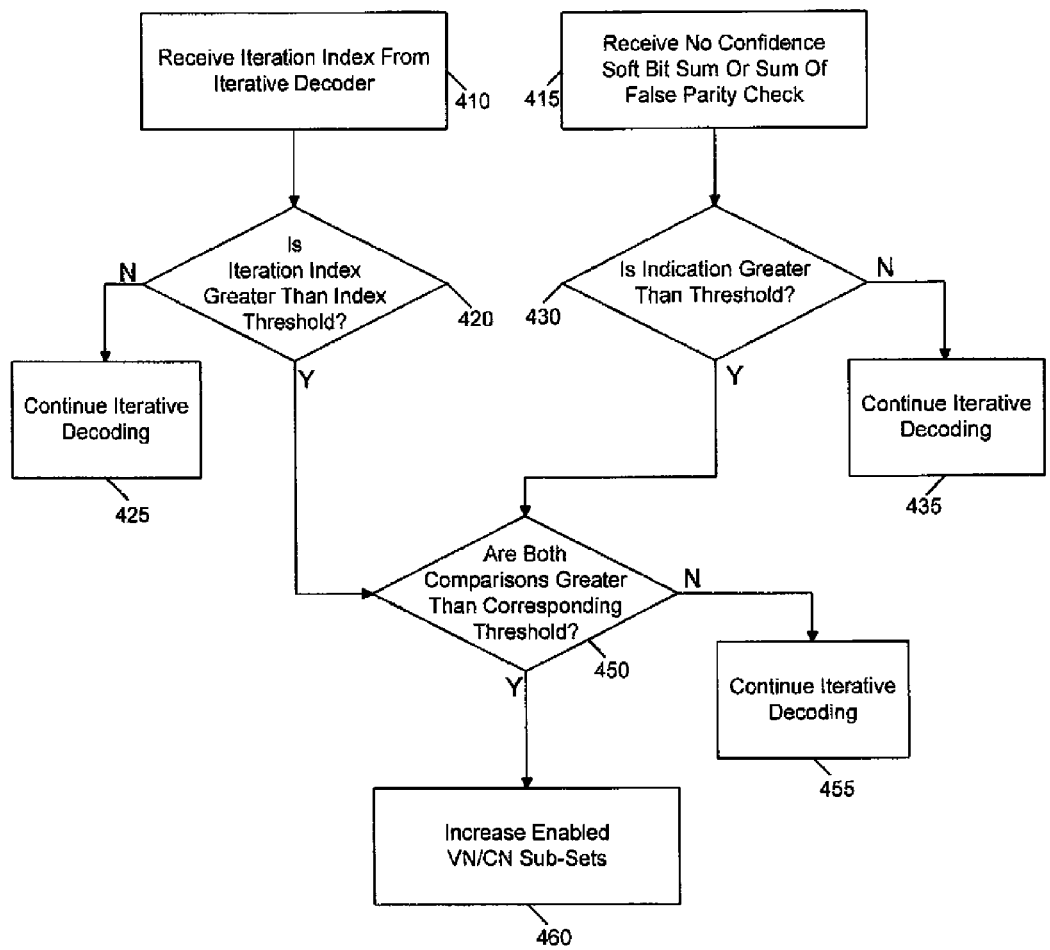
FIG. 6 is a flow diagram of a method for controlling power consumption of an iterative decoder in accordance with another embodiment of the present invention.

In addition to controlling power consumption in the face of successful error correction, embodiments of a power controller may similarly reduce power consumption by controlling a number of processing nodes (e.g., subsets) to perform the iterative decoding based on one or more predetermined criteria. Referring now to FIG. 6, shown is a flow diagram of a method in accordance with another embodiment of the present invention. As shown in FIG. 6, method 400 may be performed by a power controller, and may begin by receiving an iteration index from the iterative decoder (block 410). This iteration index may be an indication of the given number of iterations performed on a given data frame. Next, the received iteration index may be compared to an iteration index threshold at diamond 420. If it is determined that the received iteration index is greater than the iteration index threshold, control passes to block 450 discussed further below. If instead the received iteration index is less than the iteration index, control passes to block 425, where iterative decoding may be continued with the current number of processing nodes enabled for the next iteration.

Still referring to FIG. 6, method 400 may further perform a similar comparison of a no confidence soft bit sum (or false parity checksum) as described above with regard to FIG. 5. Specifically, method 400 may receive an indication of a number of failed nodes of an iterative decoder at each iteration (block 415). This received indication may be compared to a threshold to determine whether the indication is greater than the threshold (diamond 430). While the scope of the present invention is not limited in this regard, this threshold may be at a given level based on a percentage of false parity sums. If the number of the indication is greater than this threshold, meaning that the number of errors is greater than the threshold, control passes to diamond 450. Otherwise, if it is determined that the indication is less than the threshold, control passes to block 435 where iterative decoding may continue with the current number of enabled nodes.

Still referring to FIG. 6, next it may be determined at diamond 450 if both comparisons indicate that the compared values are greater than the corresponding thresholds. If so, control passes to block 460 where the number of enabled nodes or sub-sets may be increased so that the quality of the iterative the decoding may be improved. Note that if both decision branches into diamond 450 are not in the affirmative, iterative decoding may otherwise continue with the current number of enabled nodes (block 455).

Figure 7:
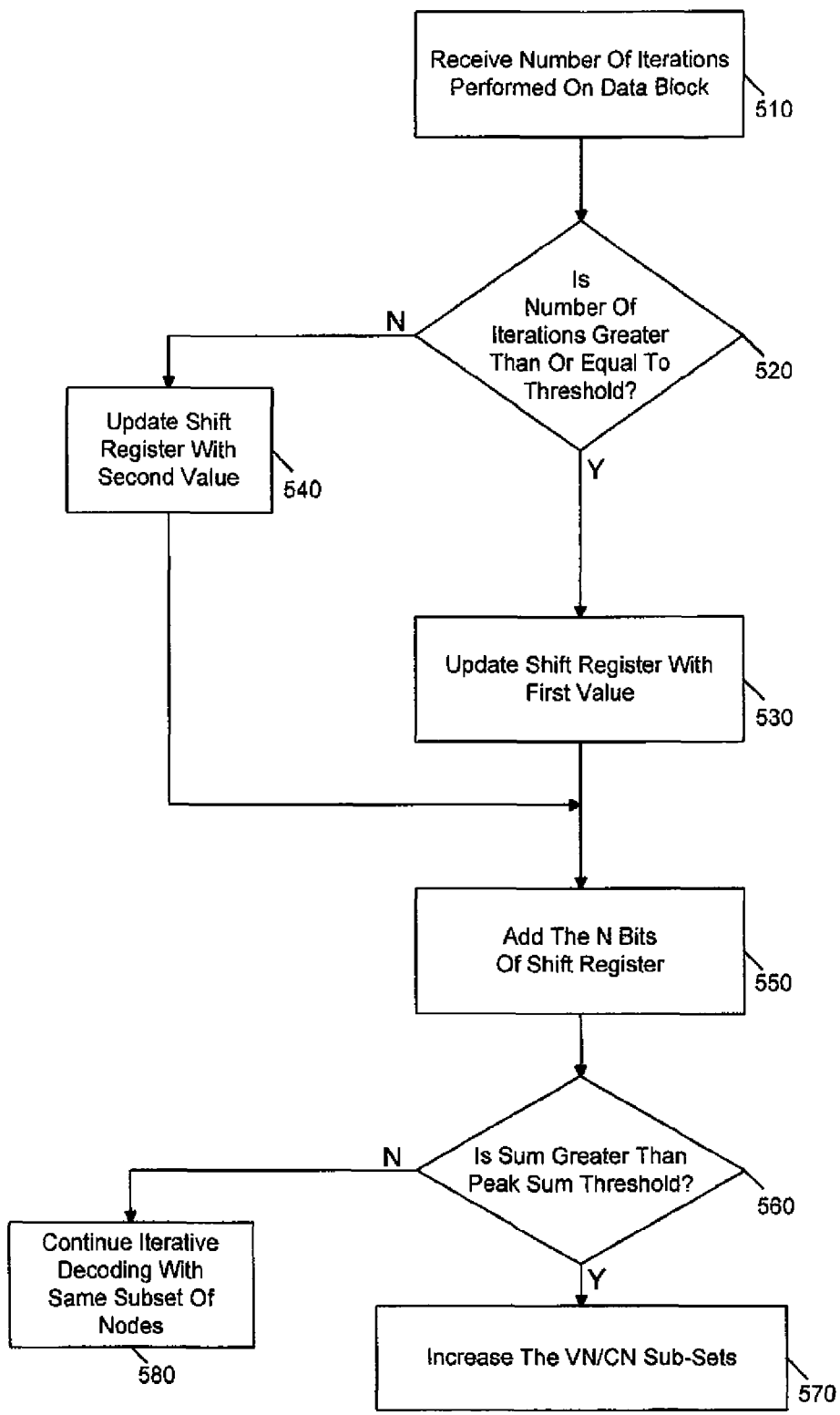
FIG. 7 is a flow diagram of a method for performing power control in accordance with yet another embodiment of the present invention.

As described above, in other implementations an iterative decoder may perform a number of iterations for a given data block (e.g. frame or sliding window) up to a maximum number of iterations allowed. However, the power controller may cause the iterative decoder to increase the number of enabled nodes if this maximum iteration number is occurring too often. Referring now to FIG. 7, shown is a flow diagram of a method for performing power control in accordance with yet another embodiment of the present invention. As shown in FIG. 7, method 500 may begin by receiving a number of iterations performed in a given data block (block 510). In one embodiment, this data block may be of a sliding window of a plurality of frames (e.g., between approximately 16 and 64 frames). This information may be received in the power controller from the iterative decoder. Next at diamond 520 it may be determined whether the number of iterations is greater than or equal to an iteration threshold (diamond 520). While this threshold may be at the maximum iteration level, a fallback iteration limit may instead act as the threshold. If the determination of diamond 520 is in the positive, a shift register may be updated with a first value (block 530). This first value may in one embodiment be a logical one value. Otherwise, if the number of iterations is below the iteration threshold, the shift register may be updated with a second value (block 540). In this embodiment, the second value may be a logical zero value.

From both of blocks 530 and 540, control passes to block 550, where N bits of the shift register may be added together. This sum is thus a measure of a number of frames within the sliding window for which more than a threshold number of iterations was performed. Then, it may be determined at diamond 560 whether the sum of the shift register bits is greater than a peak sum threshold. While the scope of the present invention is not limited in this regard, this peak sum threshold may correspond to a percentage of shift register bits having a logic one value. For example, in one instance the shift register may be a 16-bit register. In such a case, the peak sum threshold may be between approximately 4 and 8, in one embodiment. If the sum of the shift register bits is greater than the peak sum threshold, control passes to block 570, where the number of nodes enabled for iterative decoding may be increased. For example, a sub-set of the number of enabled nodes may be increased. Thus when it is determined that the number of nodes to be enabled for processing should be increased to realize more margin in a maximum number of iterations, such a change to the enabled number of iterations can occur, effectively helping to find a performance/power trade-off. If instead it is determined that the sum of the N bits of the shift registers is not greater than the peak sum threshold, the method may conclude without a change to the number of nodes enabled for processing (block 580). While shown with this particular implementation in the embodiment of FIG. 7, the scope of the present invention is not limited in this regard. Note that if the sum of N bits of the shift register is zero, a reduced VN/CN sub-set may be used. Moreover each time the VN/CN sub-set number is modified, the iteration threshold can also be modified because the maximum iteration is modified.

In still further implementations, it is possible to control the number of node processors based on the number of iterations already performed on a given data block (such as a frame). For example, to balance power consumption with decoding efficiency one scheme may be to begin iterative decoding with a relatively small number of enabled nodes or sub-sets, and as iterative decoding continues to increase the number of enabled nodes or sub-sets, depending on how many iterations have been performed.

Figure 8:
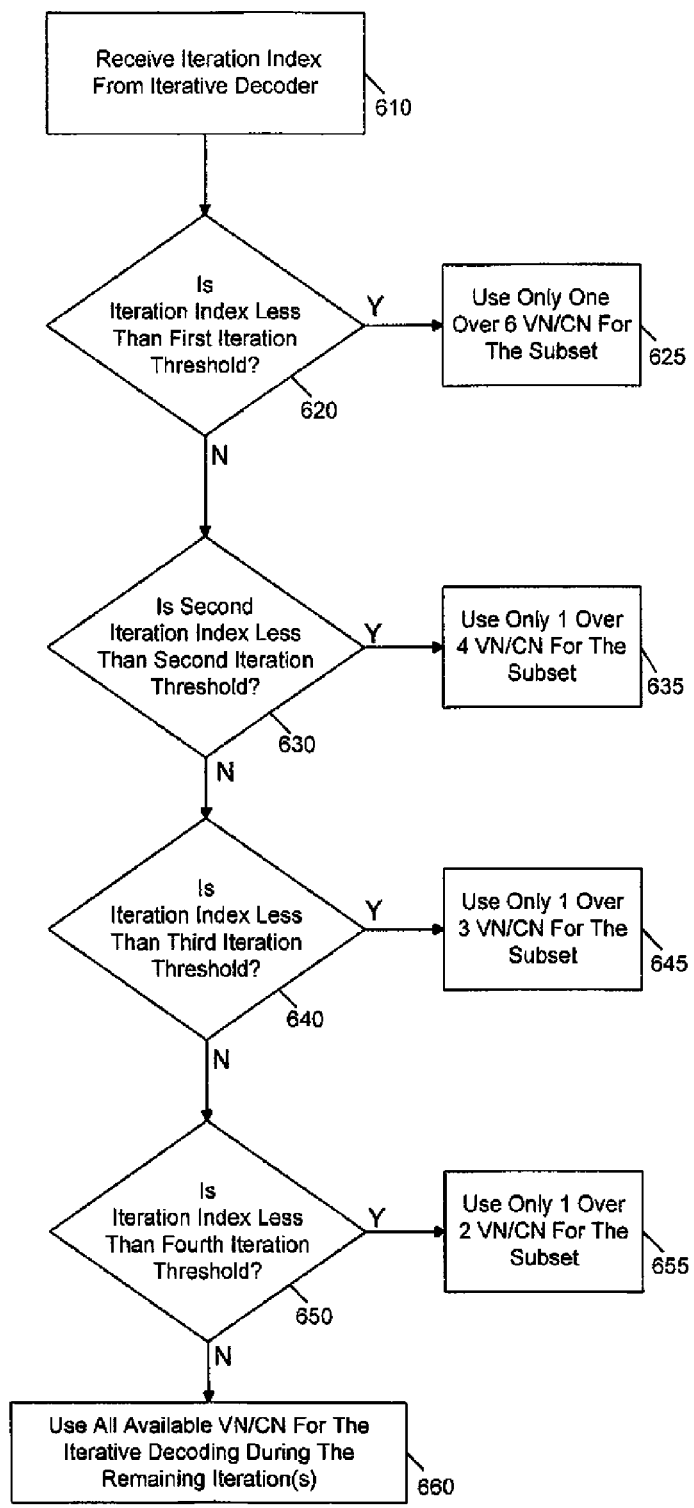
FIG. 8 is a flow diagram of a power control method in accordance with another embodiment of the present invention.

Referring now to FIG. 8, shown is a flow diagram of a power control method in accordance with yet another embodiment of the present invention. As shown in FIG. 8, method 600 may be used to perform power control by controlling the number of node sub-sets enabled based on the iterations performed. As seen, method 600 may begin by receiving an iteration index from the iterative decoder (block 610). In one embodiment, this iteration index may be received in a power controller from the iterative decoder, in which the index number increases with each iteration performed on a given data block.

Still referring to FIG. 8, a series of determinations may be made serially, each comparing the received iteration index to a corresponding iteration threshold. First, at diamond 620 it is determined whether the iteration index is less than a first threshold. This first threshold may be for a relatively small number of iterations performed, e.g., between approximately 5 and 10, in one embodiment. If it is determined that the iteration index is less than this threshold, control passes to block 625 where only a limited number of nodes may be enabled. In the specific implementation shown in FIG. 8, at block 625 only one in six nodes may be enabled, of course this number can vary in different embodiments. Thus power can be reduced as only a small number of nodes are enabled.

However, with a small number of nodes it may not be possible to correctly decode the data block within the maximum allowed number of iterations. Accordingly, the serial determinations in one or more of diamonds 630, 640, and 650 may be performed, each of which compares the received iteration index to a different iteration threshold (each of an increasing value). In this way, a greater amount of nodes may be enabled as more iterations have occurred. Then finally, at diamond 650 if it is determined that the number of iterations is greater than the final iteration threshold, control passes to block 660, where all available nodes may be used for iterative decoding during the remaining iterations. Although the scope of the present invention is not limited in this regard, in one example this last iteration threshold may be at a level between approximately 50 to 75 percent of the maximum allowable number of iterations. Thus in this instance, as the number of iterations performed is already above this level, power consumption may be traded off for a greater processing capacity in order to correctly decode the received data block.

Thus as described above, in various implementations iterative decoding may be controlled to trade off power consumption and decoding efficiency. Using the different criteria discussed above, differing numbers of subsets of the nodes can be enabled for each iteration of a given data block (such as a frame) to dynamically control power consumption. The different thresholds could be provided by a DSP or micro-controller or from a look-up table in the controller depending on code rate, constellation, symbol rate and others parameters.

Figure 9:
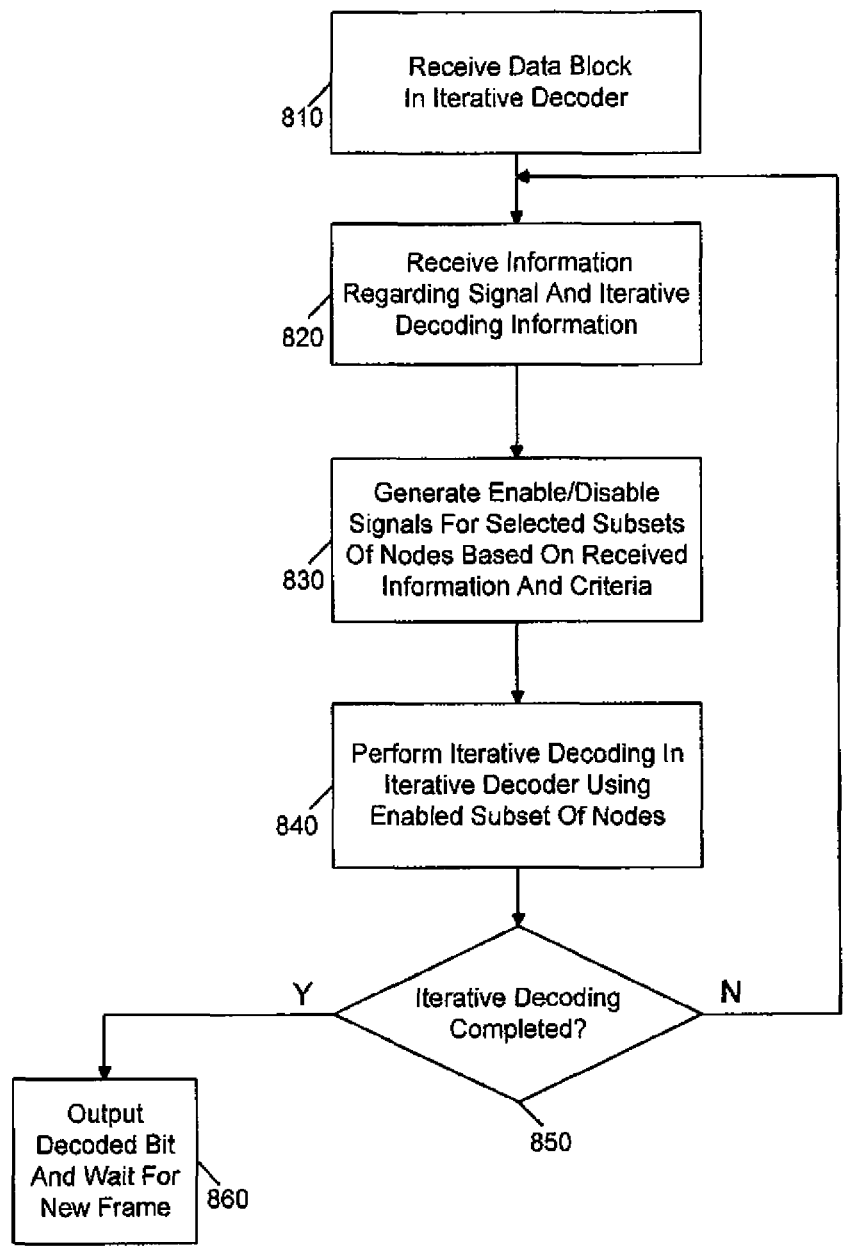
FIG. 9 is a flow diagram of a method for controlling power consumption dynamically in accordance with one embodiment of the present invention.

Referring now to FIG. 9, shown is a flow diagram of a method for controlling power consumption dynamically. As seen in FIG. 9, method 800 may begin by receiving a data block in an iterative decoder (block 810). For example, a data frame may be passed from an intrinsic memory into the variable node processors that are enabled for iterative decoding. In addition, information regarding the received signal (e.g., SNR) and iterative decoding information may be received in a power controller (block 820). Then based on this information and one or more criteria such as described above, enable/disable signals may be generated for selected sub-sets of the nodes of the iterative decoder (block 830).

Accordingly, iterative decoding may occur using the enabled sub-set of nodes (block 840). After each iteration it may be determined whether the iterative decoding has completed (diamond 850). As one example, this determination may be based on whether a number of errors detected by the different nodes of the processor is less than a threshold. If so, this means that the decoding for that data block has successfully completed, and the iterative decoding for that block can thus conclude (block 860). The decoded bit may be output, and the decoder may wait for a new frame to be available for decoding. Otherwise, control passes back to block 820, where information regarding the iterative decoding (e.g., including the iteration index for the number of iterations performed) may be received and based on the information, it is determined the number of sub-sets to enable for the next iteration. Control then passes on to blocks 830 and 840 and diamond 850 in a loop until the iterative decoding for a given data block is completed. While shown with this particular implementation the embodiment of FIG. 9, the scope of the present invention is not limited in this regard.

Figure 10:
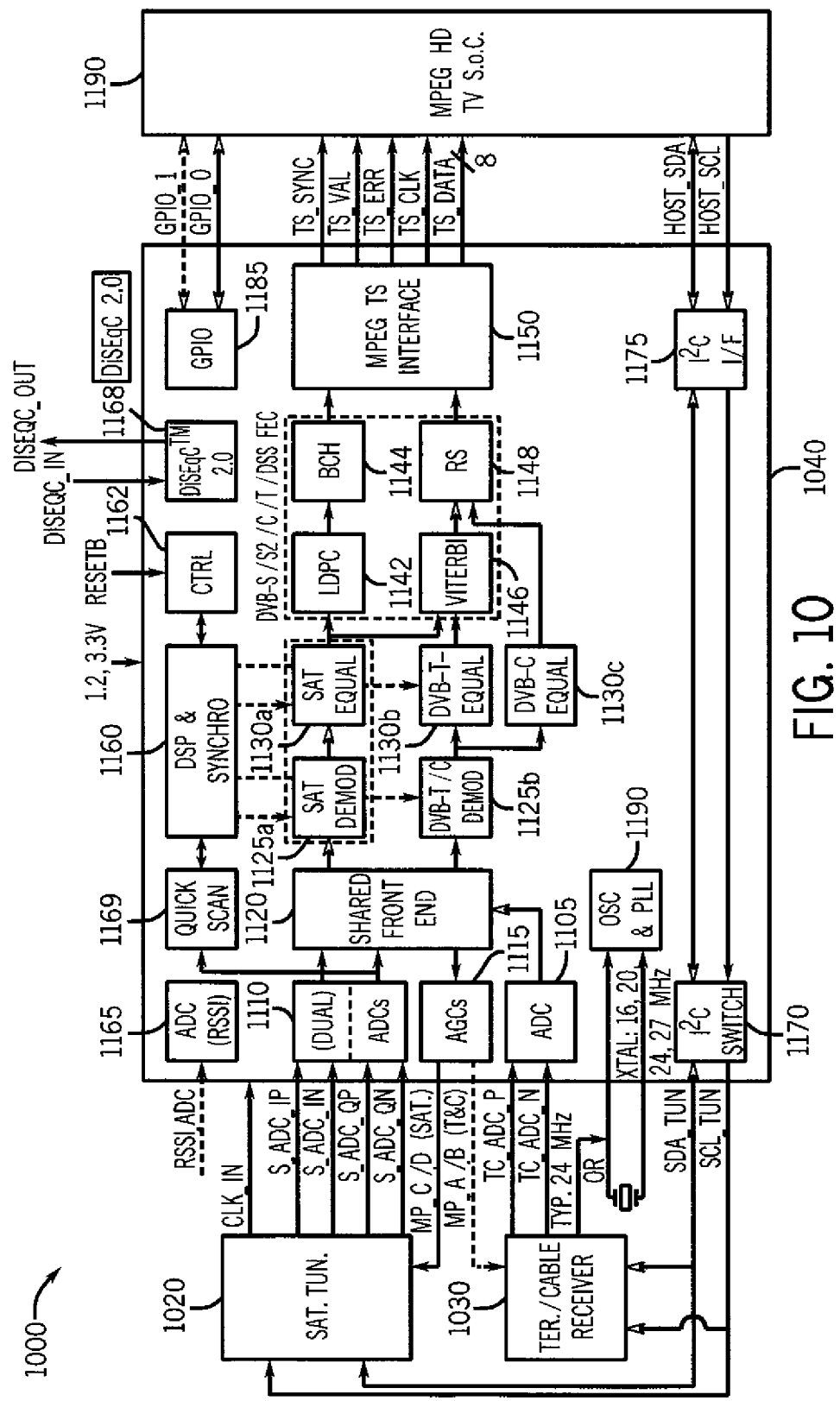
FIG. 10 is a block diagram of a system in accordance with one embodiment of the present invention.

Embodiments may be incorporated in many different types of systems employing an iterative decoder. Referring now to FIG. 10, shown is a block diagram of a system in accordance with one embodiment of the present invention. Specifically, FIG. 10 shows a system 1000 which in various embodiments may be part of a set-top box, a high definition TV or other application for use in handling receipt and processing of DVB signals. As seen, system 1000 includes a pair of tuners, each of which may be formed on a separate IC, although in some implementations such tuners as well as demodulator 1040 all may be integrated in one integrated circuit. Thus the two tuners, namely first tuner 1020 and second tuner 1030 may be configured to receive incoming RF signals of one or more DVB standards. Specifically, first tuner 1020 is configured to receive signals of a DVB-satellite standard, while second tuner 1030 may be configured to receive signals of a DVB-terrestrial or DVB-cable standard. Demodulator 1040 may be a demodulator including much shared circuitry to handle processing of signals of any DVB standards, reducing complexity, power consumption and size. In addition, system 1000 further includes a system-on-a-chip (SoC) 1190 that may be coupled to receive an output transport stream from demodulator 1040. Such SoC may be used to perform MPEG decoding to thus generate audio and video signals to be output to a display of system 1000 (not shown in FIG. 10).

FIG. 10 further shows the general signal processing path for the incoming signals, both for satellite-received signals and cable/terrestrial-received signals. In various embodiments, much sharing of components of the signal processing path may occur to thus reduce chip real estate. In this way, demodulator 1040 may be fabricated on a single die with a minimum amount of real estate consumed. That is, rather than having independent (i.e., dedicated) signal processing paths for multiple different standards that are adapted on either a single die or multiple dies, many of the components can be shared to provide as many opportunities for re-use for different standards as possible.

Specifically as seen in FIG. 10, incoming satellite signals are provided through ADCs 1110 to a shared front end 1120. This shared front end 1120 may further be configured to handle incoming cable or terrestrial signals received through ADC 1105. Thus a single front end is provided to perform various signal processing on incoming signals, which may be at a given IF, to filter and downconvert them to baseband signals.

With regard to a signal processing path for satellite signals, the processed signals from shared front end 1120 may be provided to a demodulator $1125_a$ which in various embodiments may include QPSK and 8PSK demodulators to handle a given DTV-S/S2 standard. Demodulation may be performed under control of a digital signal processor (DSP)/synchronizer 1160. The demodulated signals are then provided to an equalizer $1130_a$ for performing channel corrections. Depending on the given standard (e.g., DVB-S or DVB-S2) the equalized signals may be provided to different portions of a forward error correction (FEC) circuit 1140. Specifically, a first path may include a Viterbi decoder 1146 and a Reed-Solomon (RS) decoder 1148, which may be used to handle decoding of, e.g., DVB-S signals. If instead the incoming information is of the DVB-S2 standard, the equalized signals from equalizer $1130_a$ may be provided to a LDPC decoder 1420 and BCH decoder 1440. The LDPC and BCH decoders may provide for improved broadcast reception while limiting the size and power consumption of the demodulator, as described above. The decoded transport stream may be provided to a MPEG transport stream interface 1150 that in turn outputs various transport stream information to SoC 1190. The transport stream interface may be programmable to provide a flexible range of output modes and is fully compatible with any MPEG decoder or conditional access modules to support any back-end decoding chip.

For incoming terrestrial or cable signals from shared front end 1120, these signals are provided to a second demodulator $1125_b$, one of a second equalizer $1130_b$ and a third equalizer $1130_c$, and onto shared FEC circuit 1140. Equalized terrestrial and cable signals may be decoded using Viterbi decoder 1146 and Reed-Solomon decoder 1148 before being output through MPEG transport stream interface 1150. Note that the circuitry of the signal processing paths may be dedicated hardware, in contrast to generic processing hardware such as present in DSP 1160.

Various other circuitry may be present within demodulator 1140, including, for example, a RSSI ADC 1165, automatic gain control circuitry 1150 which may, based on signal strength information, send various control signals to control gain elements of tuners 1020 and 1030. Additional interfaces include a DiSEqC™ interface 1168 for satellite dish control, a control interface 1162 which may receive an incoming reset signal and which is in communication with DSP/synchronizer 1160. In addition, various general-purpose IO signals may be communicated via a general-purpose IO interface 1185. I²C communication may be via an I²C switch 1170 and an I²C interface 1175. Various control and clock signals needed may be generated using an oscillator/phase lock loop 1190 which may be coupled to, e.g., an off-chip crystal or other clock source. While shown with this particular implementation in the embodiment of FIG. 10, the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   an iterative decoder including:
      a plurality of variable node processors each to receive a channel input and at least one of a plurality of check node values and to calculate a variable node value;
      a variable node memory including a plurality of nodes each associated with one of the variable node processors;
      a shuffle unit coupled to receive a variable node value from each of the plurality of variable node processors and to provide the variable node value to at least one of a plurality of check node processors coupled to the shuffle unit;
      the plurality of check node processors each to receive at least one variable node value and to calculate a check node value including a parity value and a magnitude value;
      a check node memory including a plurality of nodes each associated with one of the check node processors; and
      a controller coupled to the plurality of variable node processors, the variable node memory, the plurality of check node processors, the check node memory, and the shuffle unit to individually enable or disable each of the corresponding variable node processors, the variable node memory, the plurality of check node processors, and the check node memory during iterative decoding.

2. The apparatus of claim 1, further comprising an adder coupled to the plurality of check node processors to receive a first output from each of the plurality of check node processors having a first value if the parity value is of a false parity and to generate a false parity sum.

3. The apparatus of claim 2, wherein the controller is to receive the false parity sum and to control iterative decoding on a current block of the channel input based at least in part on the false parity sum.

4. The apparatus of claim 3, wherein the controller is to compare the false parity sum to a first threshold and to adjust a number of enabled variable node processors and check node processors based on the comparison.

5. The apparatus of claim 4, wherein the controller is to increase the number of enabled variable node processors and check node processors if the false parity sum is greater than the first threshold, the first threshold indicative of unsuccessful decoding.

6. The apparatus of claim 5, where the controller is to compare an iteration index corresponding to a number of iterations performed in the iterative decoder on the current block to a second threshold, the second threshold less than a maximum number of iterations allowed to be performed by the iterative decoder on the current block, and increase the number of enabled variable node processors and check node processors only if the false parity sum is greater than the first threshold and the iteration index is greater than the second threshold.

7. The apparatus of claim 2, wherein the controller is to enable a first number of the variable node processors and check node processors to perform iterative decoding on a current block if an iteration index corresponding to a number of iterations performed in the iterative decoder on the current block is less than a first index threshold, and if the iteration index is greater than the first index threshold and less than a second index threshold enable a second number of the variable node processors and check node processors to perform the iterative decoding, the second number greater than the first number.

8. The apparatus of claim 1, wherein the controller is to determine a number of times that the iterative decoding has been performed a maximum number of iterations during a window and to control the number of enabled variable node processors and check node processors if the number of times is greater than a third threshold.

9. The apparatus of claim 8, further comprising a shift register including a plurality of entries each to store a first value if iterative decoding on a block of the channel input was performed the maximum number of iterations and to store a second value if iterative decoding on the block was not performed the maximum number of iterations.

10. The apparatus of claim 9, wherein the controller is to increase the number of enabled variable node processors and check node processors if the stored number of times is greater than the third threshold and to reduce the number of enabled variable node processors and check node processors if the stored number of times equals zero.

11. The apparatus of claim 1, further comprising a channel noise estimator coupled to the controller to estimate a level of noise in a signal from which the channel input is obtained, wherein the controller is to control the number of enabled variable node processors and check node processors based at least in part on a comparison of the noise level to a threshold.

12. A method comprising:
   performing iterative decoding on a demodulated signal obtained from a received radio frequency (RF) signal in an iterative decoder to provide a decoded signal, the iterative decoding having a plurality of nodes each including a variable node processor and a check node processor;
   receiving information regarding the iterative decoding;
   comparing a signal-to-noise ratio (SNR) of an incoming signal from which the demodulated signal is obtained to a threshold, and determining a number of subsets of the nodes to enable for a next iteration of the iterative decoder based at least in part on the SNR; and
   controlling the iterative decoder for the next iteration based on the determined number of subsets.

13. The method of claim 12, wherein the determining includes comparing a false parity sum of an iteration of the iterative decoding on a block of the demodulated signal to a threshold, and adjusting the number of enabled selected subsets of the nodes based on the comparison.

14. The method of claim 13, further comprising increasing the number of enabled selected subsets of the nodes if the false parity sum is greater than the threshold.

15. A system comprising:

a receiver to receive radio frequency (RF) signals of a plurality of digital video broadcasting (DVB) standards and to downconvert the received RF signal to a baseband signal and demodulate the baseband signal into a demodulated signal, the receiver having a forward error correction (FEC) circuit including an iterative decoder to decode the demodulated signal into a decoded signal and a controller coupled to the iterative decoder to individually enable or disable each of a plurality of nodes of the iterative decoder each including a variable node processor and a check node processor, a variable node memory portion and a check node memory portion, based at least in part on information regarding a number of iterations of iterative decoding performed on a current block of the demodulated signal.

16. The system of claim 15, wherein the controller is to enable a first number of the plurality of nodes to perform iterative decoding on the current block if an iteration index corresponding to a number of iterations performed in the iterative decoder on the current block is less than a first index threshold, and if the iteration index is greater than the first index threshold and less than a second index threshold enable a second number of the plurality of nodes to perform the iterative decoding, the second number greater than the first number.

17. The system of claim 15, wherein the receiver includes at least one integrated circuit (IC) including a tuner to receive the RF signals of at least one DVB standard and to provide a downconverted signal to a second integrated circuit (IC) including the iterative decoder.

18. The system of claim 15, wherein the controller is to receive a sum corresponding to a number of the plurality of nodes having a false parity for a given iteration and to control a number of enabled nodes for a next iteration of iterative decoding on the current block based at least in part on a comparison between the sum and a threshold indicative of unsuccessful decoding.

19. The system of claim 15, wherein the controller is to enable a first number of the plurality of nodes during a N iteration, a second number of the plurality of nodes during an iteration occurring after the N iteration, and enable all of the plurality of nodes if a number of iterations is greater than a final iteration threshold, each threshold corresponding to a number of nodes activated.

* * * * *